(12) United States Patent
Bugbee et al.

(10) Patent No.: US 8,248,171 B1
(45) Date of Patent: Aug. 21, 2012

(54) TEMPERATURE CORRECTING CURRENT-CONTROLLED RING OSCILLATORS

(75) Inventors: Martin Bugbee, Southampton (GB); Andrew Burtt, Southampton (GB)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/015,277

(22) Filed: Jan. 27, 2011

(51) Int. Cl.
*H03K 3/03* (2006.01)

(52) U.S. Cl. ............................ 331/57; 331/176; 331/185

(58) Field of Classification Search .................. 331/176, 331/57, 185
See application file for complete search history.

(56) References Cited

U.S. PATENT DOCUMENTS

| 5,180,995 | A  | * | 1/1993 | Hayashi et al. .................. 331/57 |
| 6,339,349 | B1 | * | 1/2002 | Rajagopalan ................. 327/131 |
| 7,839,224 | B2 |   | 11/2010 | Nishiyama et al. |
| 2003/0102901 | A1 | | 6/2003 | Ooishi |
| 2005/0052923 | A1 | | 3/2005 | Uchikoba et al. |
| 2009/0085676 | A1 | | 4/2009 | Nishiyama et al. |
| 2010/0066434 | A1 | | 3/2010 | Liao et al. |
| 2010/0134087 | A1 | | 6/2010 | Hwang et al. |

FOREIGN PATENT DOCUMENTS

| JP | 2001-068976 A | 3/2001 |
| JP | 2005-102007 A | 4/2005 |
| WO | 2004/008639 A2 | 1/2004 |

OTHER PUBLICATIONS

B. Datta, et al: "Analysis of a Ring Oscillator Based on Chip Thermal Sensor in 65nm Technology," retrieved from Internet: http//www.unix.ecs.umas.edu/-dkumar/lab4 658 report/lab4 report.htm (2005).
European Search Report; EP1215922, May 8, 2012.

* cited by examiner

*Primary Examiner* — Arnold Kinkead

(57) ABSTRACT

A thermally-compensated oscillator has a current reference with an output current which relates to an ambient temperature with a first relationship, a ring oscillator having an operating frequency which relates to the ambient temperature with a second relationship, and which receives the output current of the current reference and outputs an oscillator signal, and a level shifter which receives the oscillator signal from the ring oscillator and outputs a corresponding voltage-regulated clock signal.

15 Claims, 6 Drawing Sheets

TEMPERATURE CORRECTING CURRENT-CONTROLLED RING OSCILLATORS

FIELD OF THE INVENTION

This invention relates generally to current-controlled ring oscillators, and, more specifically, to regulating a frequency of a current-controlled ring oscillator's output signal in accordance with ambient temperature.

BACKGROUND OF THE INVENTION

Many integrated circuit devices require stable oscillators to provide the reference clocks used in the system. Since virtually all integrated circuit devices operate in environments whose temperature fluctuates, such a reference clock should exhibit a stable oscillating frequency over a range of operating temperatures. Furthermore, it is desirable for a reference clock to exhibit a stable oscillating frequency over a range of operating voltages, and also not be affected by process variations which might arise during device manufacture.

Many applications necessitate that the device's power consumption be made as small as possible; for example, battery powered devices and/or RFID (radio frequency identification) tags benefit from a reduction in power consumption. In the case of battery powered devices, decreasing power consumption can increase the time required until battery recharging or replacement is required, and/or permit the use of a battery storing less power (which, typically, is a smaller, lighter and less costly battery).

In the case of an RFID device, power consumption and operating range vary inversely, so if power consumption decreases, the operating range increases.

The oscillator also should consume as little area as possible on silicon, at least in part to reduce the cost of manufacture of the device, to allow greater design flexibility, and to provide a more compact device.

Ring oscillators are one type of device suitable for use as clocks in integrated circuit devices. A ring oscillator can consist of a odd number of NOT gates which are connected in series such that the output of the last NOT gate is fed back to the input of the first NOT gate. Since each NOT gate cannot switch output state instantaneously, time is required for a signal to propagate from the input of the first NOT gate through the series of gates and thereby change the state at the output of the last NOT gate. This looping behaving contributes to the operating frequency of the ring oscillator.

It is known that the performance of ring oscillators is temperature dependent, as discussed by Datta et al. in the article "Analysis of a Ring Oscillator Based on Chip Thermal Sensor in 65 nm Technology" (2005).

Many consumer and professional electronic devices can be used at operating temperatures typically ranging from −40° C. to 125° C., particularly if those devices are portable. It is therefore likely that a device using a ring oscillator to provide a clock signal will experience temperature fluctuations, resulting in temperature-induced variations in the clock signal by that ring oscillator. Such clock signal variations could undesirably affect device performance, or require the inclusion of compensating components or logic in the device to cope with those variations.

Current solutions to this problem are not satisfactory. For example, one option, the RC oscillator, requires the use of a more-than-minimal silicon area.

Accordingly, there is a need for a ring oscillator whose performance is substantially independent of operating temperature.

SUMMARY OF THE INVENTION

This invention proposes a scheme for temperature correcting a current controlled ring oscillator, preferably to thereby provide a stable clock reference over temperature fluctuations (and, possibly (by careful design), supply voltage variations). The proposed solution has the advantage that it requires minimal silicon area as compared to other solutions, such as an RC oscillator, operates at low power supply levels and is relatively temperature independent.

One aspect of this invention is a thermally-compensated oscillator having a current reference with an output current which has a first relationship to an ambient temperature, a ring oscillator having an operating frequency which has a second relationship to the ambient temperature, and which receives the output current of the current reference and outputs an oscillator signal, and a level shifter which receives the oscillator signal from the ring oscillator and outputs a corresponding voltage-regulated clock signal.

A further aspect of this invention is that the first relationship can be selected to have a value such that the second relationship is constant over a temperature range.

Another aspect of this invention is a method of regulating a ring oscillator by providing a current with a value which has a first relationship to an ambient temperature, applying the current to a ring oscillator having an operating frequency which has a second relationship to the ambient temperature, the ring oscillator in response outputting an oscillator signal, and using the oscillator signal to generate a corresponding voltage-regulated clock signal.

Yet another aspect of this invention is selecting the first relationship with a value such that the second relationship is constant over a temperature range.

DETAILED DESCRIPTION OF EXEMPLARY EMBODIMENTS

Figure 1:
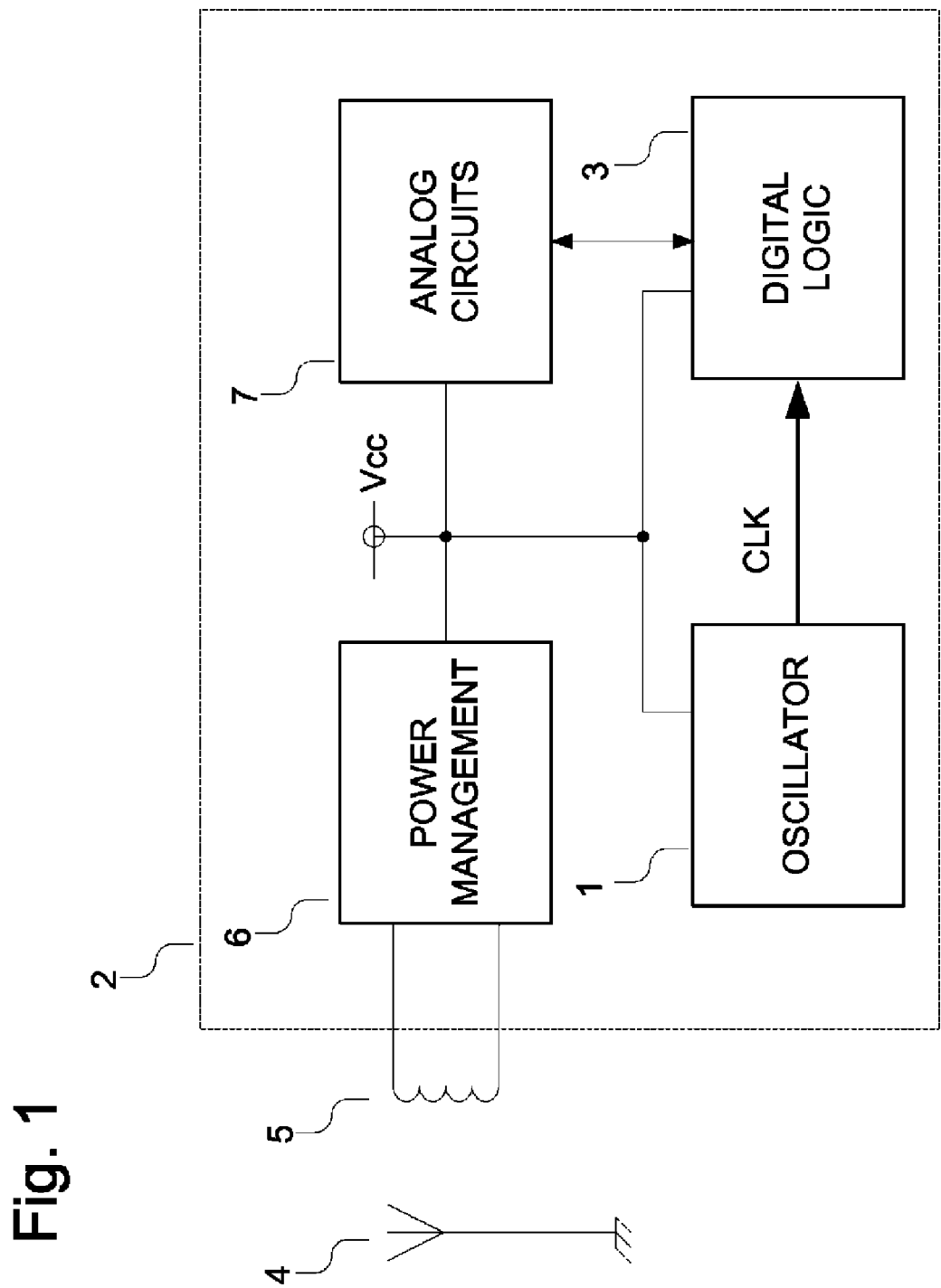
FIG. 1 is a schematic diagram showing an exemplary RFID device which can employ an oscillator in accordance with this invention.

FIG. 1 depicts an exemplary RFID device 2. Device 2 is powered in a known manner by an antenna 5, which, during device operation, is located within the RF field emitted by transmitter 4 ("within" is used generally and means that the RF field is sufficiently strong to result in power generation in the RFID device 2). The amount of power required by the device 2 for operation directly affects the maximum distance from the transmitter 4 that the device 2 can operate at. The oscillator 1 in the device 2 supplies the clock signals(s) used by the digital logic 3 in the device 2.

A simple very low power oscillator could be made by using a current starved ring oscillator and trimming the bias current required so that the oscillator operates at a specific frequency. However the operating frequency of that ring oscillator will be temperature dependent when the ring oscillator is biased with a fixed reference current.

A proportional to absolute temperature (PTAT) current source can have its temperature coefficient adjusted to compensate for the temperature coefficient of the current-controlled oscillator (CCO). This can be done by providing the PTAT with one or more resistors having different temperature coefficients, which thereby change the temperature dependence of the PTAT.

Figure 2:
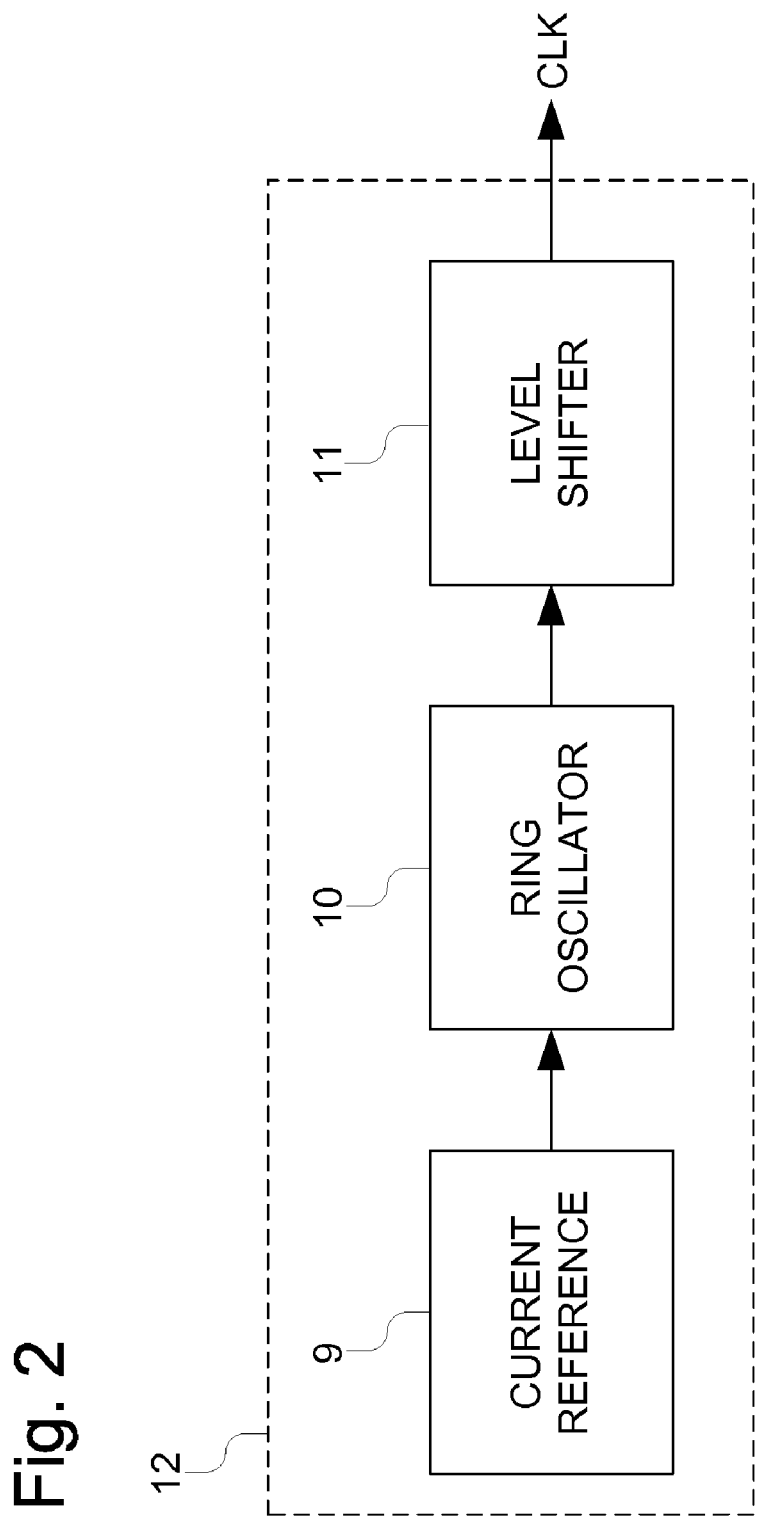
FIG. 2 is a schematic diagram showing a clock device in accordance with this invention.

FIG. 2 shows a proposed oscillator device 12 in accordance with this invention, consisting of a reference current supply 9, a current-controlled ring oscillator 10, and a level shifter 11 which converts the output of the ring oscillator to full logic level swing so that the output can be used as a clock signal. Typically the bias current supplied by the reference current supply 9 to the ring oscillator 10 will be trimmed to allow the frequency of oscillation to be accurately defined. Such trimming is accomplished in known ways.

In principle, bipolar devices could also be used to generate the PTAT current source, since such devices also exhibit a PTAT Vbe difference. However, presently, this configuration is not thought to be preferred.

Figure 4:
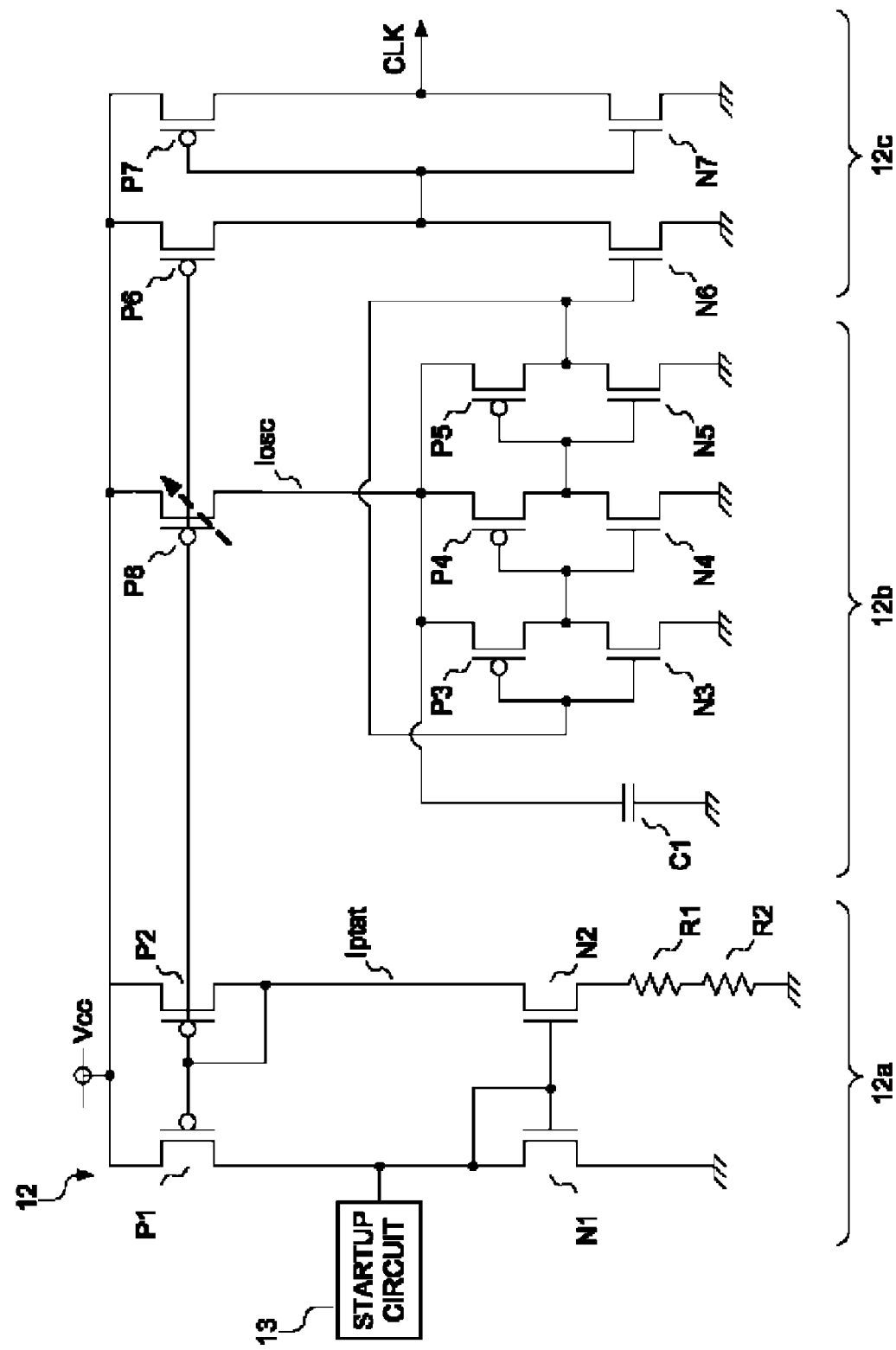
FIG. 4 is a circuit diagram depicting a clock device in accordance with this invention.

FIG. 4 shows one possible implementation for the oscillator 12. Oscillator 12 includes a PTAT current reference section 12a, a ring oscillator section 12b, and a level shifter section 12c, which are all powered by supply voltage Vcc. Startup circuit 13 inputs an initial signal to the oscillator's PTAT current reference 12a, and level shifter 12c outputs a clock signal CLK, which can be used in known fashion.

The PTAT current reference 12a is constructed from n-type MOSFET transistors N1, N2, P1, P2 and resistors R1 and R2. In theory, the same circuit topology could be employed with other types of transistors, i.e., bipolar, although the particular characteristics of the type of transistors used will be a factor in the circuit's design.

In FIG. 4, the source of transistor N1 is grounded directly, and the source of transistor N2 is grounded via resistors R1 and R2. The gates of transistors N1 and N2 are connected to each other and also to the drain of transistor N1. The gates of transistors P1 and P2 are connected to each other and also to the drain of transistor P2. The sources of transistors P1 and P2 are connected to voltage supply Vcc to power the PTAT current reference.

Figure 3A:
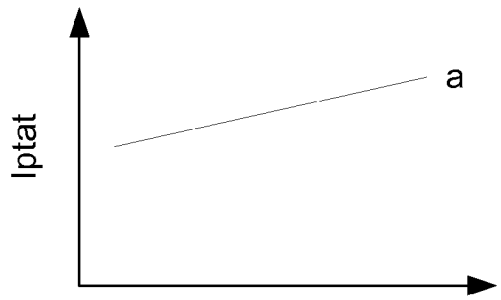
FIGS. 3A through 3D are graphs depicting relationships between (1) various oscillator currents and frequencies and (2) temperature.

As shown in FIG. 3A, if the resistors R1 and R2 have no temperature dependence then the output current of the current reference Iptat will be directly proportional to the temperature, as shown by line a.

Figure 3B:
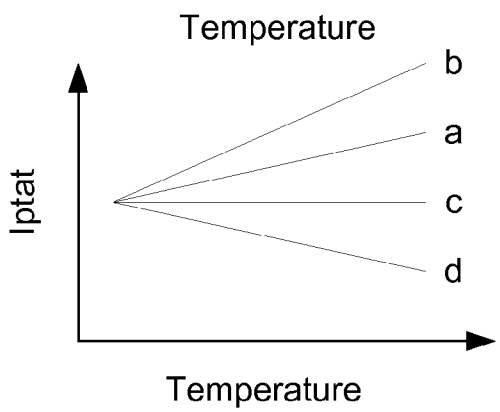

If instead one uses a combination of resistors R1 and R2 having different temperature coefficients, by suitably selecting R1 and R2, the resulting temperature coefficient of the current reference can be varied, as is shown by lines a-d in FIG. 3B. Line a corresponds to FIG. 3A, wherein the resistors R1 and R2 have no temperature dependence so that the output current Iptat is directly proportional to temperature, line b corresponds to resistors R1 and R2 have a direct temperature dependence such that Iptat is more dependent upon temperature than when R1 and R2 have no temperature dependence (line a), line c corresponds to R1 and R2 being chosen such that Iptat has a constant (temperature invariant) value, and line d corresponds to R1 and R2 chosen to result in a negative temperature dependence for Iptat. It should be understood that the results depicted in FIG. 3B assume resistors with positive and negative temperature coefficients are available in the process technology used to manufacture the oscillator 12. The manner in which R1 and R2 (at least one of which has a resistance that varies in relationship to the ambient temperature) can be chosen to control Iptat will be discussed in detail hereafter.

While FIGS. 3A and 3B show linear relationships between Iptat and temperature, it should be understood that if the resistances of at least some of the resistors used do not vary linearly with temperatures, these Iptat-temperature relationships also will not be linear. This in fact may be useful in, for example, situations where the current which the ring oscillator needs to maintain a constant frequency is not linear with temperature. By carefully selecting resistor types and absolute resistances, one can then obtain adequate temperature compensation.

Figure 6:
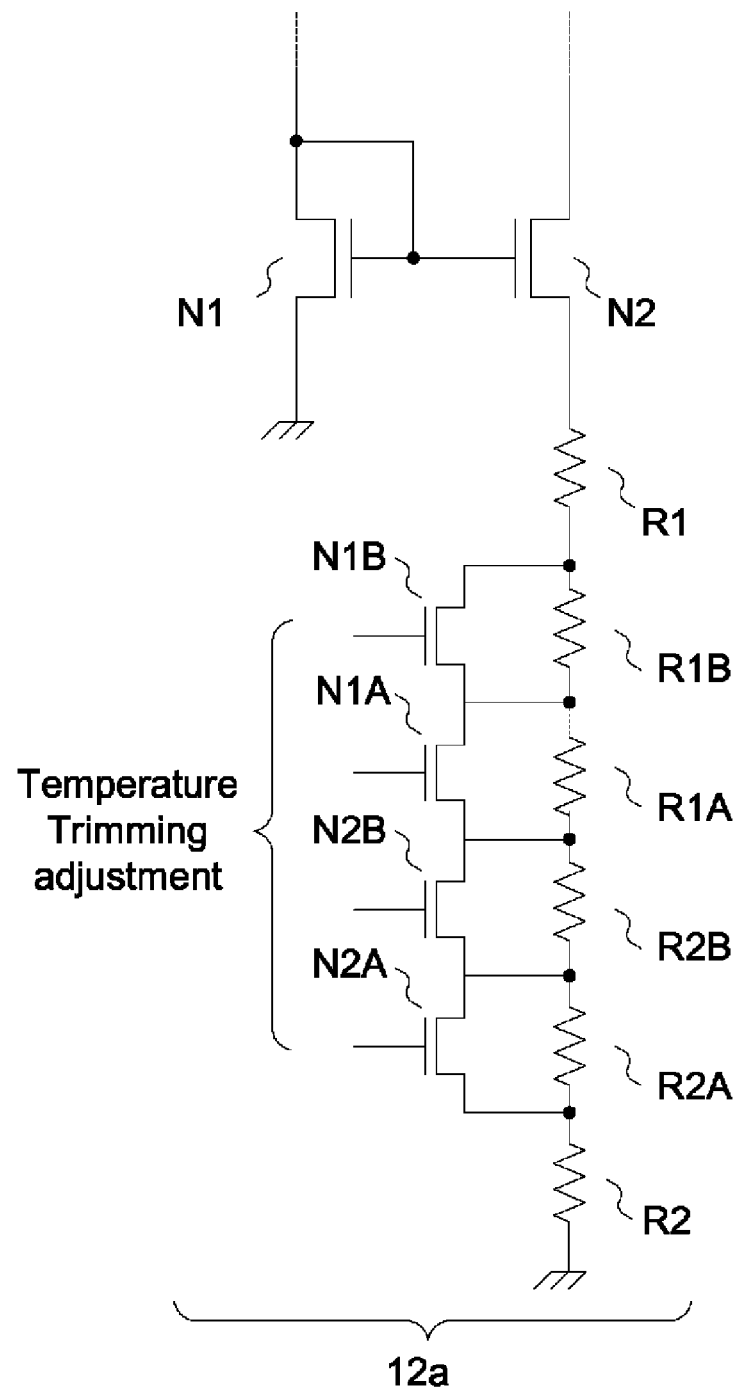
FIG. 6 is a schematic diagram of a modification of a portion of the clock device of FIG. 4 which can facilitate trimming of resistors to minimize temperature dependence.

If required, R1 and R2 can optionally be trimmed during production testing to minimize the temperature dependence of the oscillator after manufacture. An implementation of an example trimming scheme is shown in FIG. 6, which depicts a modification of the PTAT current reference section 12a of the oscillator 12 of FIG. 4. In this configuration, rather than provide only two calibration resistors R1 and R2 (as in FIG. 4), resistors R1A, R1B, R2A and R2B are provided along with associated n-type MOSFET transistors N1B, N1A, N2B, N2A. Transistors N1B, N1A, N2B and N2A can be driven selectively (by actuating circuitry and logic not shown) to allow the resistors R1B, R1A, R2B and R2A to be switched into or out of the circuit leg between the source of transistor N2 and ground as desired so that the absolute PTAT current can be trimmed (a total of 16 possible curves are possible). This permits adjustment of the effective value of R1 and R2 and therefore changes the temperature characteristic of the reference (depending upon their relative resistances when compared with R1 and R2, the family of Iptat v. Temp curves may not show a simple offset difference, but also a small temperature dependent offset). Furthermore, trimming could be performed during the operational life of the oscillator, if necessary or desired.

Returning to FIG. 4, the reference current Iptat from PTAT 12a is mirrored from the gate of transistor P2 to the gate of transistor P8, which is part of the ring oscillator 12b. Ring oscillator 12b is constructed from transistors N3, N4, N5 and P3, P4, P5 (ring oscillator 12b is shown as a three stage ring oscillator by way of example only and not limitation, and the present invention is suitable for use with ring oscillators having any number of stages). The current mirrored from the PTAT to the ring oscillator is trimmed using transistor P8, which acts as a current DAC (by switching in different sized devices to mirror the bias current), this allows the frequency of the ring oscillator to be production trimmed to the required value. It will be appreciated that this arrangement is particularly beneficial because it can compensate for process, variations that might affect the properties of one or more components used in the oscillator 12.

Figure 3C:
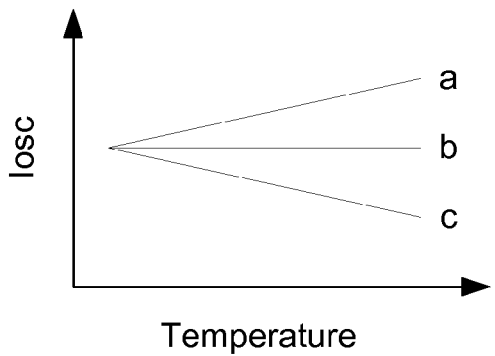

FIG. 3C shows the temperature dependence of the current Iosc supplied by PTAT current reference 12a, that current Iosc being supplied to the sources of transistors P3, P4, P5. As explained previously, the temperature dependence (or independence) of the current output by PTAT current reference 12a depends upon the properties of resistors R1 and R2; resistors R1 and R2 can be chosen so that the current Iosc varies positively with temperature (line a), negatively with temperature (line c), or remains temperature invariant (line b).

The current required to keep ring oscillator 12b operating at a fixed frequency will vary with temperature. Typically if the voltage at the drain of transistor P8 is >> Vtn, Vtp (Threshold voltages of N3-N5, P3-P5) then the current required will increase with temperature. As this voltage is lowered the temperature dependency will decrease.

The present invention compensates for the temperature dependence of ring oscillator 12b by providing a PTAT current reference 12a which has a temperature dependence complementary to the temperature dependence of the ring oscillator 12b. That is, the ring oscillator can be matched to the current reference, or the current reference can be matched to the ring oscillator. By matching the temperature dependency of the current reference to the current required for the ring oscillator 12 b to operate at a fixed frequency, a temperature-independent oscillator 12 can be constructed, as shown in FIG. 3D.

Figure 3D:
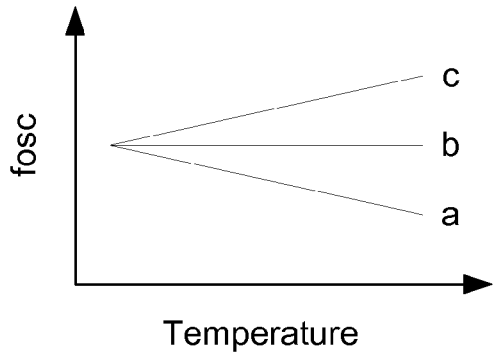

This invention takes advantage of the fact that the output frequency, fosc, of the ring oscillator 12b varies inversely with the temperature dependence of the current Iosc applied thereto (this follows at least from FIGS. 3C and 3D).

Selecting resistors R1 and R2 to obtain a particular temperature-reference current Iptat relationship, leading to a particular temperature-current Iosc relationship, as discussed above, will result in a ring oscillator whose output frequency, as shown in FIG. 3D, can be made constant (line b), can be made to vary directly with temperature (line c), or can be made to vary inversely with temperature (line a).

That is, if the current Iptat output by PTAT reference 12a has a particular direct relationship to temperature (FIG. 3B, line b) through the use of R1 and R2 at least one of which has a resistance that increases directly with temperature, the current Iosc supplied by the oscillator 12 will be temperature-invariant (FIG. 3C, line b), and the operating frequency of ring oscillator 12b also will be temperature invariant (FIG. 3D, line b).

In the same way, if the current Iptat output by PTAT reference 12a has a direct relationship to temperature (FIG. 3B, line a) through the use of R1 and R2 at least one of which has a resistance that does not vary with temperature, the current Iosc output by oscillator 12 will vary directly with temperature (FIG. 3C, line a), and the operating frequency of oscillator 12 will vary inversely with temperature (FIG. 3D, line a).

If the current Iptat output by PTAT reference 12a does not vary with temperature (FIG. 3B, line c) through the use of R1 and R2 at least one of which has a resistance that varies inversely with temperature, the current Iosc output by the oscillator 12 will vary inversely with temperature, and the operating frequency of the oscillator 12 will vary directly with temperature (FIG. 3D, line c).

Returning to FIG. 4, the output of the ring oscillator 12b is level shifted to digital switching levels by level shifter 12c, using transistors N6, P6 and that output is buffered with transistors N7, P7. The level shifter output is then available as a clock signal CLK, which can be supplied to devices which employ such a clock signal. Other level shifting schemes are well known and can be used.

Figure 5:
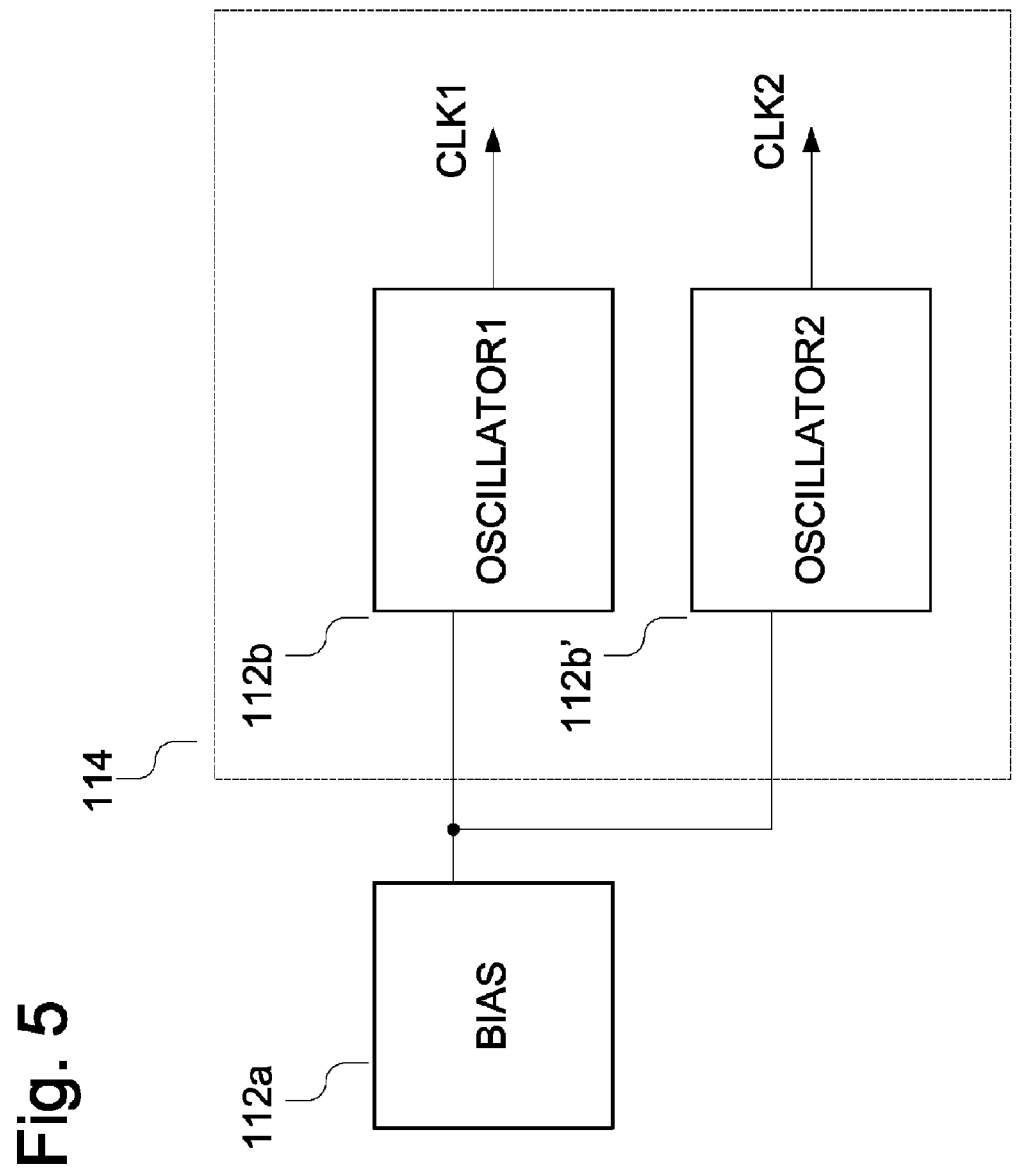
FIG. 5 is a schematic diagram showing an embodiment in which one reference circuit can drive several oscillators.

FIG. 5 depicts a further configuration of this invention in which portions corresponding to portions already described above are identified with the same reference numbers incremented by 100. Here, a biased PTAT reference 112a comparable to PTAT reference 12a described above can be used to drive multiple ring oscillators 112b, 112b', respectively having outputs CLK1 and CLK2, and which together are part of oscillator section 114. More than two ring oscillators could be provided. If desired, the ring oscillators can have different operating frequencies, resulting in an multi-frequency temperature invariant oscillator 112.

This invention allows the use of a minimal number of components and minimal silicon in comparison to a conventional compared to an RC-based oscillator, which can require large-sized passive components. Additionally, it is predicted that, for a 140 nm, 1.2-2.0V design, this invention can operate at relatively low voltages, around 2 Vt, and consumes a relatively small amount of power (less than approximately 700 nA in this example).

The accuracy of the oscillator has been shown by both prediction and testing to be +/−3% over 125° C. in a 140 nm process for a 1 MHz oscillator, this being worst case performance over process and temperature without trimming of temperature dependence of the PTAT (as shown in FIG. 6).

An additional feature of the implementation is that the frequency of oscillation can be made linear (or at least substantially linear) with temperature (FIG. 3D, lines A or C) by an appropriate choice of R1 and R2 in the PTAT current reference 12a.

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

The present invention has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this invention encompasses inconsequential variations in the relevant tolerances and properties of components and modes of operation thereof Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present invention, the only relevant components of the device are A and B.

What is claimed is:

1. A thermally-compensated oscillator, comprising:
   a current reference having an output current which has a first relationship to an ambient temperature;
   at least one ring oscillator having an operating frequency which has a second relationship to the ambient temperature, and which receives the output current of the current reference and in response outputs an oscillator signal; and a level shifter which receives the oscillator signal from the ring oscillator and outputs a corresponding voltage-regulated clock signal, wherein the current reference includes a first grounded MOSFET transistor and a second grounded MOSFET transistor, the first MOSFET transistor and the second MOSFET transistor being gate-coupled, and a source of the second MOSFET transistor being grounded via a resistance which has a third relationship to the ambient temperature, wherein the current reference further comprises:

a third MOSFET transistor and a fourth MOSFET transistor, the third and the fourth MOSFET transistors being gate-coupled and supplying the output current to the ring oscillator, wherein the first and second MOSFET transistors are of a same channel type, and the third and fourth MOSFET transistors are of an opposite channel type to the first and second MOSFET transistors.

2. A thermally-compensated oscillator according to claim 1, wherein the third relationship has a value such that the first relationship corresponds to a proportional increase in the output current over a temperature range.

3. A thermally-compensated oscillator according to claim 2, wherein the first relationship has a value such that the second relationship is constant over the temperature range.

4. A thermally-compensated oscillator according to claim 3, wherein a frequency of the oscillator signal is constant over the temperature range.

5. A thermally-compensated oscillator according to claim 1, the resistance comprising least two resistors.

6. A method of regulating a ring oscillator, comprising:
providing a current which has a first relationship to an ambient temperature using a current reference;
applying the current to a ring oscillator having an operating frequency which has a second relationship to the ambient temperature, the ring oscillator in response outputting an oscillator signal; and
using the oscillator signal to generate a corresponding voltage-regulated clock signal,
wherein the current reference includes a first grounded MOSFET transistor and a second grounded MOSFET transistor, the first MOSFET transistor and the second MOSFET transistor being gate-coupled, and a source of the second MOSFET transistor being grounded via a resistance which has a third relationship to the ambient temperature, wherein the current reference further comprises:

a third MOSFET transistor and a fourth MOSFET transistor, the third and the fourth MOSFET transistors being gate-coupled and supplying the output current to the ring oscillator, wherein the first and second MOSFET transistors are of a same channel type, and the third and fourth MOSFET transistors are of an opposite channel type to the first and second MOSFET transistors.

7. A method according to claim 6, wherein the third relationship has a value such that the first relationship corresponds to a proportional increase in the current over a temperature range.

8. A method according to claim 7, wherein the first relationship has a value such that the second relationship is constant over the temperature range.

9. A method according to claim 8, wherein a frequency of the oscillator signal is constant over the temperature range.

10. A method according to claim 6, wherein the resistance includes at least two resistors.

11. A method according to claim 6, wherein the using step is performed by a level shifter.

12. The thermally-compensated oscillator of claim 1, wherein the third and fourth MOSFET transistors are of a first channel type, and wherein the first channel type is opposite to the channel type of the first and second MOSFET transistors.

13. The thermally-compensated oscillator of claim 1, wherein gate terminals of the third and fourth MOSFET transistors are directly connected to each other.

14. The method of claim 6, wherein the third and fourth MOSFET transistors are of a first channel type, and wherein the first channel type is opposite to the channel type of the first and second MOSFET transistors.

15. The method of claim 6, wherein gate terminals of the third and fourth MOSFET transistors are directly connected to each other.

* * * * *